(12) United States Patent
Oshima

(10) Patent No.: US 12,374,607 B2
(45) Date of Patent: Jul. 29, 2025

(54) PACKAGE SUBSTRATE, PACKAGE SUBSTRATE PROCESSING METHOD, AND PACKAGED CHIP

(71) Applicant: DISCO CORPORATION, Tokyo (JP)

(72) Inventor: Naotaka Oshima, Tokyo (JP)

(73) Assignee: DISCO CORPORATION, Tokyo (JP)

(*) Notice: Subject to any disclaimer, the term of this patent is extended or adjusted under 35 U.S.C. 154(b) by 501 days.

(21) Appl. No.: 17/820,838

(22) Filed: Aug. 18, 2022

(65) Prior Publication Data

US 2023/0054183 A1    Feb. 23, 2023

(30) Foreign Application Priority Data

Aug. 23, 2021 (JP) ................... 2021-135916

(51) Int. Cl.
*H01L 23/495* (2006.01)
*H01L 21/56* (2006.01)
(Continued)

(52) U.S. Cl.
CPC ...... *H01L 23/49548* (2013.01); *H01L 21/561* (2013.01); *H01L 23/3107* (2013.01); *H01L 24/48* (2013.01); *H01L 2224/48245* (2013.01)

(58) Field of Classification Search
CPC ............ H01L 23/49548; H01L 21/561; H01L 23/3107; H01L 24/48; H01L 2224/48245;
(Continued)

(56) References Cited

U.S. PATENT DOCUMENTS 8,076,181 B1  12/2011 Pruitt et al.
2009/0317945 A1* 12/2009 Izumi ............... H01L 21/78
257/E21.499
(Continued)

FOREIGN PATENT DOCUMENTS

JP  2018206995 A  12/2018
JP  2020129637 A   8/2020

OTHER PUBLICATIONS

Office Action issued in counterpart Singapore patent application No. 10202250758K, Oct. 8, 2024.
(Continued)

*Primary Examiner* — Thanh T Nguyen
(74) *Attorney, Agent, or Firm* — GREER BURNS & CRAIN, LTD.

(57) ABSTRACT

A package substrate includes a metallic lead frame that includes first frame portions in a lattice shape along planned dividing lines and a plurality of first electrode portions extending from each of the first frame portions, a connection frame that includes second frame portions in a lattice shape along the planned dividing lines and a plurality of second electrode portions extending from each of the second frame portions, the connection frame being superposed on a side of the lead frame on which a device chip is disposed, and a mold resin that covers the device chip and the connection frame. Distal ends of the second electrode portions are formed in a protruding shape and connected to the first electrode portions, and the connection frame forms an electrode when electroplating processing is applied to sections of the first electrode portions.

1 Claim, 11 Drawing Sheets

(51) Int. Cl.
*H01L 23/00* (2006.01)
*H01L 23/31* (2006.01)

(58) Field of Classification Search
CPC . H01L 2224/48091; H01L 2224/48247; H01L 2224/97; H01L 2924/181; H01L 2924/1815; H01L 23/49582; H01L 23/49537
See application file for complete search history.

(56) References Cited

U.S. PATENT DOCUMENTS

| | | | | |
|---|---|---|---|---|
| 2017/0162530 | A1* | 6/2017 | Lin | H01L 23/49503 |
| 2019/0341323 | A1* | 11/2019 | Nishimura | H01L 23/49838 |
| 2020/0258832 | A1 | 8/2020 | Matsumoto et al. | |
| 2022/0344173 | A1* | 10/2022 | Kovitsophon | H01L 21/4839 |

OTHER PUBLICATIONS

Office Action issued in counterpart Japanese patent application No. 2021-135916, dated Apr. 14, 2025.

* cited by examiner

PACKAGE SUBSTRATE, PACKAGE SUBSTRATE PROCESSING METHOD, AND PACKAGED CHIP

BACKGROUND OF THE INVENTION

Field of the Invention

The present invention relates to a package substrate, a package substrate processing method, and a packaged chip.

Description of the Related Art

A package substrate (quad flat non-leaded (QFN) package substrate) is used in which semiconductor device chips are mounted in a metallic frame body (lead frame) and are sealed by a mold resin. A plurality of electrodes typically formed of copper (Cu) are provided on a top surface of the QFN package substrate in such a manner as to be exposed along planned dividing lines (streets). Each of the plurality of electrodes is connected to a device chip via a wire or the like within the QFN package substrate.

QFN packaged chips are formed by dividing the plurality of electrodes along the planned dividing lines by a cutting blade and thus severing the QFN package substrate (see Japanese Patent Laid-Open No. 2018-206995, for example). The electrodes made of copper are exposed on side portions of the QFN packaged chips thus formed.

SUMMARY OF THE INVENTION

The electrodes made of copper tend to be oxidized, and solder wetting characteristics are degraded once the electrodes are oxidized. When the solder wetting characteristics are degraded, the electrodes of the QFN packaged chips are not easily fixed to a wiring board such as a printed board or the like via solder.

Accordingly, what is called a wettable flank is known in which plating processing is applied to at least parts of the electrodes made of copper, the parts being exposed on the side portions of the QFN packaged chips, in order to prevent the degradation in the solder wetting characteristics. The mechanical strength of solder joint parts between the electrodes made of copper and the wiring board is enhanced by applying the plating processing. In this case, side surfaces are formed in the electrodes by half cutting the electrodes by a cutting blade. Thereafter, the plating processing is performed on top surfaces and side surfaces of the electrodes, and then, division into individual packaged chips is performed by cutting the centers of cut grooves by a thin blade.

However, in a case where the electrodes are half cut by a predetermined depth, there are many problems in that it is difficult to form grooves of a high-accuracy cutting depth because the package substrate has a thickness variation and a warp, and that clogging of the cutting blade and a burr on the electrodes (metal) tend to occur when the metal is half cut.

It is accordingly an object of the present invention to provide a package substrate, a package substrate processing method, and a packaged chip that can relax accuracy of cutting depth.

In accordance with an aspect of the present invention, there is provided a package substrate in which a device chip mounted in a frame is covered by a mold resin. The package substrate includes a metallic lead frame that includes first frame portions in a lattice shape along planned dividing lines demarcating a supporting portion on which the device chip is disposed and a plurality of first electrode portions extending from each of the first frame portions toward opposite sides, a connection frame that includes second frame portions in a lattice shape along the planned dividing lines and a plurality of second electrode portions extending from each of the second frame portions toward opposite sides, the connection frame being superposed on a side of the lead frame on which the device chip is disposed, and the mold resin that covers the connection frame and the device chip disposed to be electrically connected to the first electrode portions of the lead frame. Distal ends of the second electrode portions are formed in a protruding shape and connected to the first electrode portions of the lead frame, and the connection frame forms an electrode when electroplating processing is applied to sections of the first electrode portions, the sections being formed by severing the first electrode portions from the first frame portions.

In accordance with another aspect of the present invention, there is provided a method for processing a package substrate in which a device chip mounted in a frame is covered by a mold resin. The package substrate includes a metallic lead frame that includes first frame portions in a lattice shape along planned dividing lines demarcating a supporting portion on which the device chip is disposed and a plurality of first electrode portions extending from each of the first frame portions toward opposite sides, a connection frame that includes second frame portions in a lattice shape along the planned dividing lines and a plurality of second electrode portions extending from each of the second frame portions toward opposite sides, the connection frame being superposed on a side of the lead frame on which the device chip is disposed, and the mold resin that covers the connection frame and the device chip disposed to be electrically connected to the first electrode portions of the lead frame. The method includes a cut groove forming step of forming a cut groove having a depth not reaching the connection frame covered by the mold resin, by making a first cutting blade cut into one of the first frame portions of the lead frame along corresponding one of the planned dividing lines on a top surface on which the lead frame of the package substrate is exposed, and exposing, in the cut groove, cut surfaces of the first electrode portions that are severed when the first frame portion is cut, a plating processing step of, after the cut groove forming step is performed, covering the exposed cut surfaces of the first electrode portions with a plating layer by electroplating by applying a voltage to the severed first electrode portions via the connection frame, a dividing step of, after the plating processing step is performed, dividing the package substrate into individual packaged chips by cutting a center of the cut groove by a second cutting blade thinner than the first cutting blade to sever the connection frame and the mold resin, and a solder fixing step of connecting the first electrode portions of one of the packaged chips that have undergone plating processing and electrodes of a wiring board as a mounting destination to one another by solder, with the top surface of the packaged chip disposed to face the wiring board.

In accordance with a further aspect of the present invention, there is provided a packaged chip in which a device chip mounted on a supporting portion of a metallic lead frame is covered by a mold resin. A top surface of the packaged chip on which the supporting portion is exposed and a side surface of the packaged chip are connected to each other by a stepped portion having a predetermined height and width. A first electrode portion of the lead frame electrically connected to the device chip is exposed on the top surface of the packaged chip and a surface of the stepped portion that is continuous with the top surface. A section of a second electrode portion of a connection frame, the second electrode portion having an end portion connected to the first electrode portion, is exposed on a side surface continuous from the stepped portion to an undersurface of the packaged chip. The first electrode portion is covered by a plating layer, but the second electrode portion of the connection frame is not covered by the plating layer.

Each aspect of the present invention produces an effect of being able to relax accuracy of cutting depth.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the accompanying drawings. The present invention is not limited by contents described in the following embodiment. In addition, constituent elements described in the following include constituent elements readily conceivable by those skilled in the art and essentially identical constituent elements. Further, configurations described in the following can be combined with each other as appropriate. Moreover, various omissions, replacements, or modifications of configurations can be performed without departing from the spirit of the present invention.

First Embodiment

Figure 1:
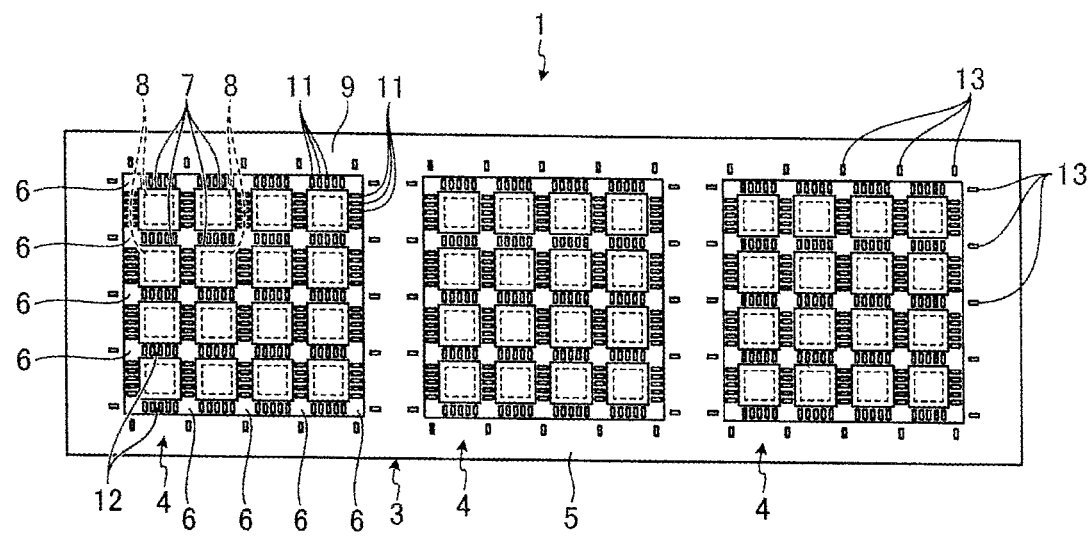
FIG. 1 is a plan view schematically illustrating a package substrate according to a first embodiment.
Figure 2:
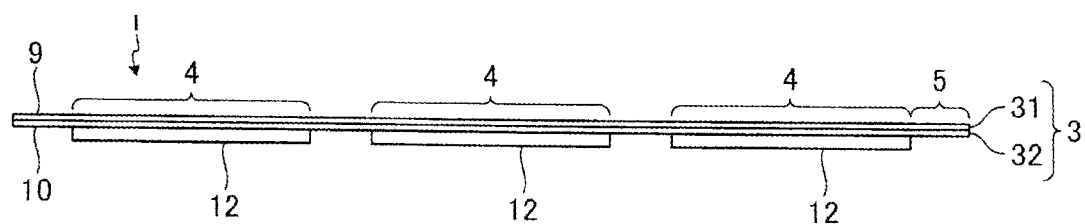
FIG. 2 is a side view of the package substrate illustrated in FIG. 1.
Figure 3:
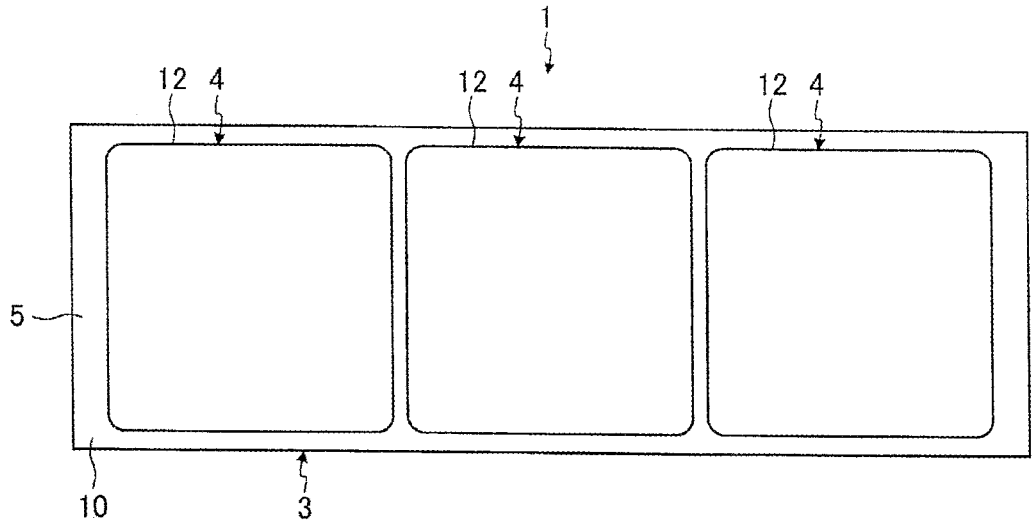
FIG. 3 is a plan view of the undersurface side of the package substrate illustrated in FIG. 1.
Figure 4:
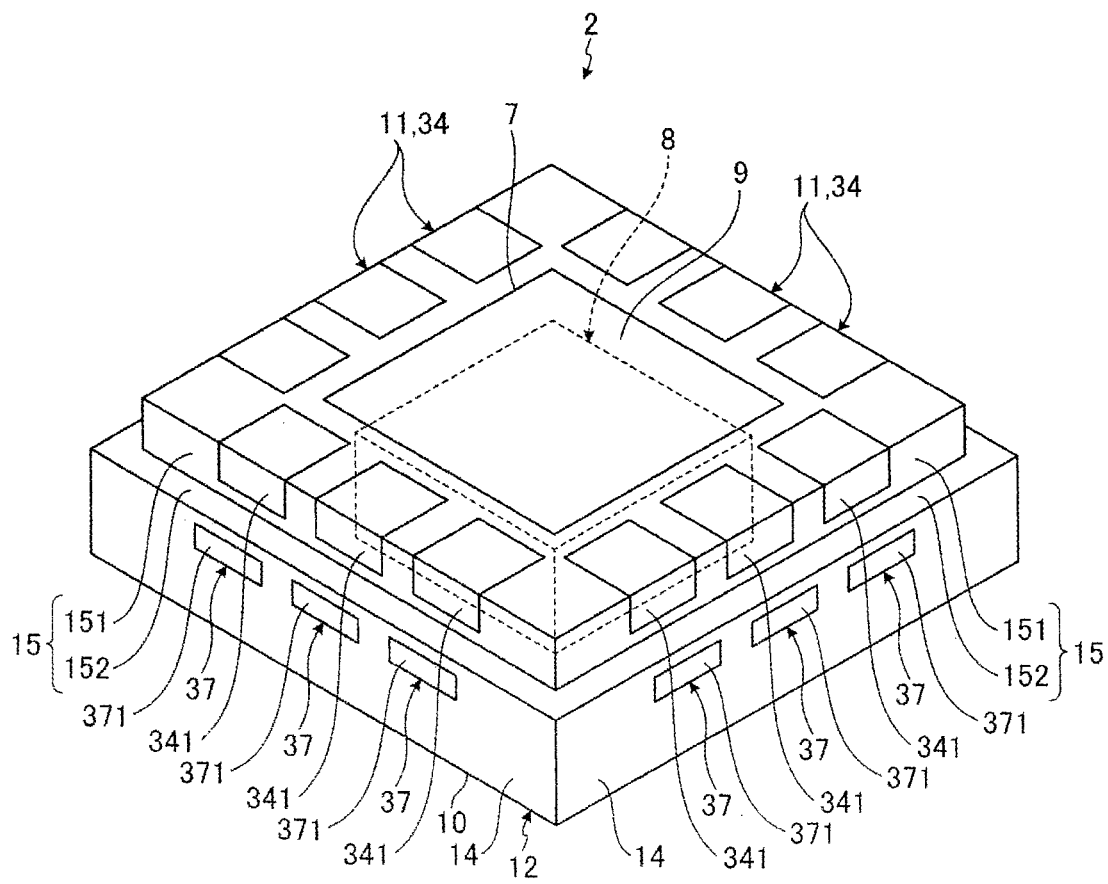
FIG. 4 is a perspective view schematically illustrating a packaged chip obtained by dividing the package substrate illustrated in FIG. 1.
Figure 5:
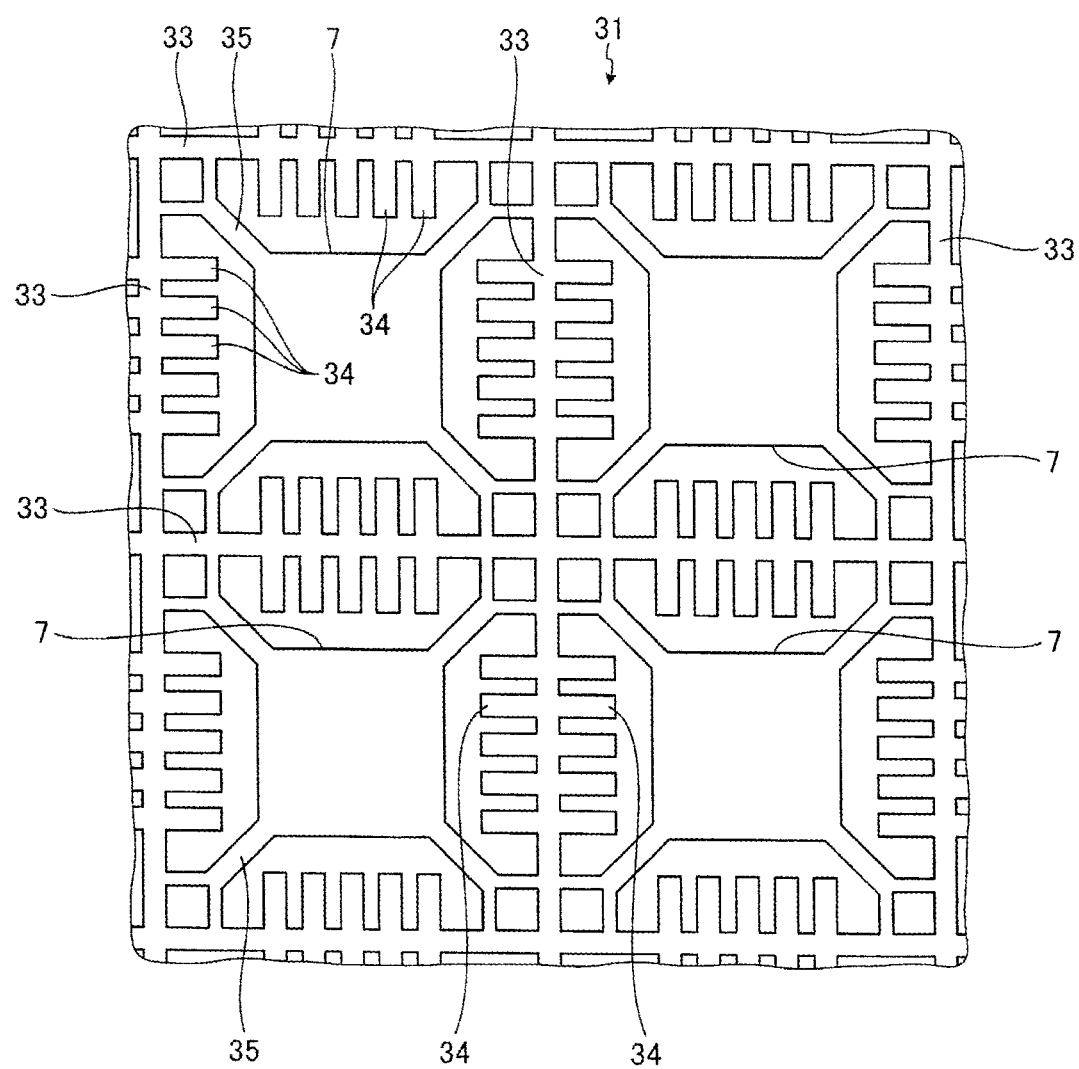
FIG. 5 is a plan view illustrating principal parts of a lead frame constituting a frame of the package substrate illustrated in FIG. 1.
Figure 6:
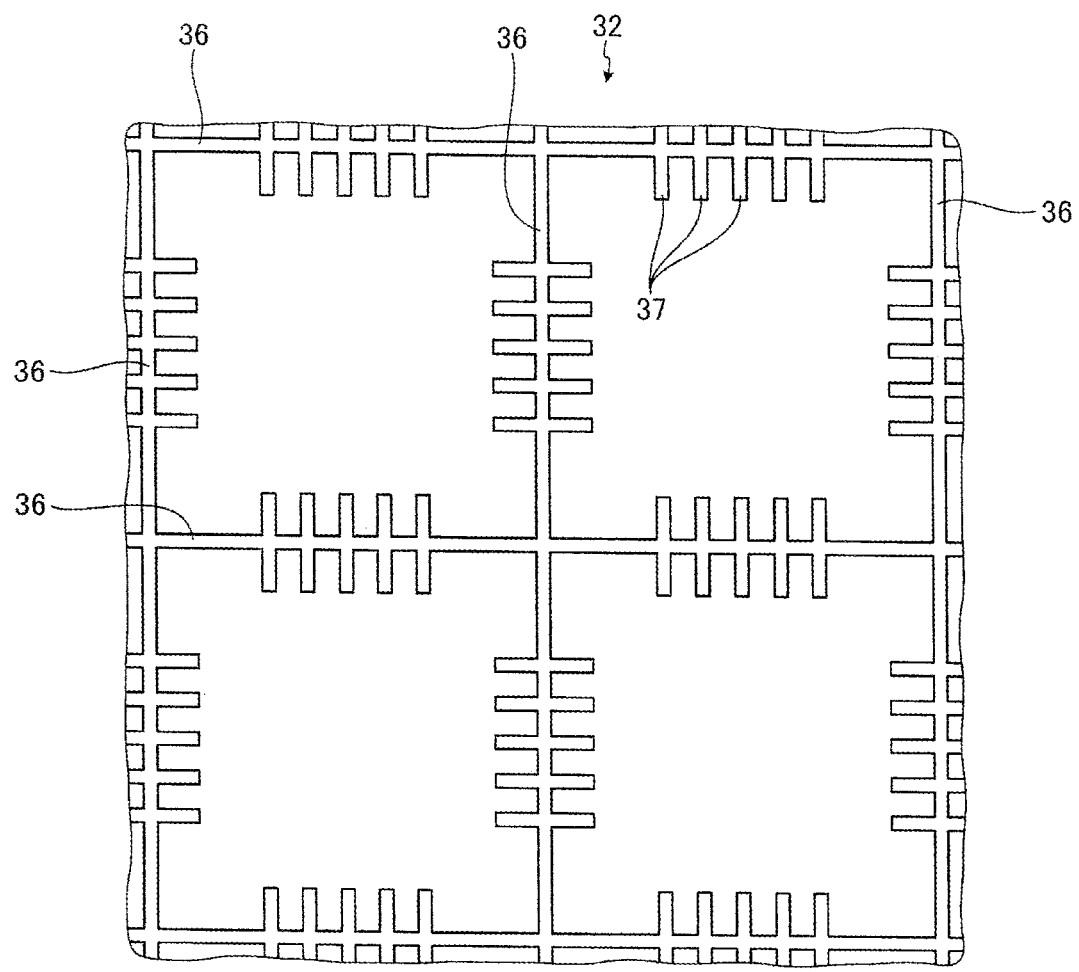
FIG. 6 is a plan view illustrating principal parts of a connection frame constituting the frame of the package substrate illustrated in FIG. 1.
Figure 7:
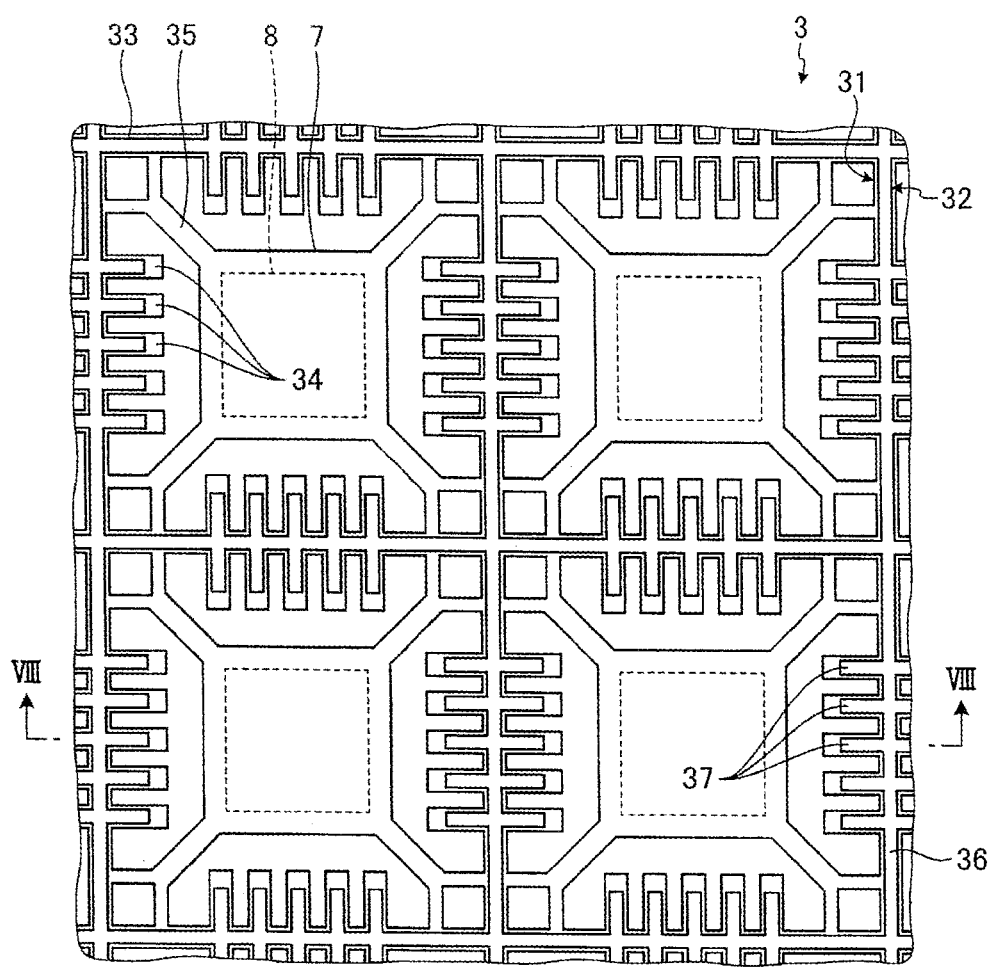
FIG. 7 is a plan view illustrating principal parts of the frame of the package substrate illustrated in FIG. 1.
Figure 8:
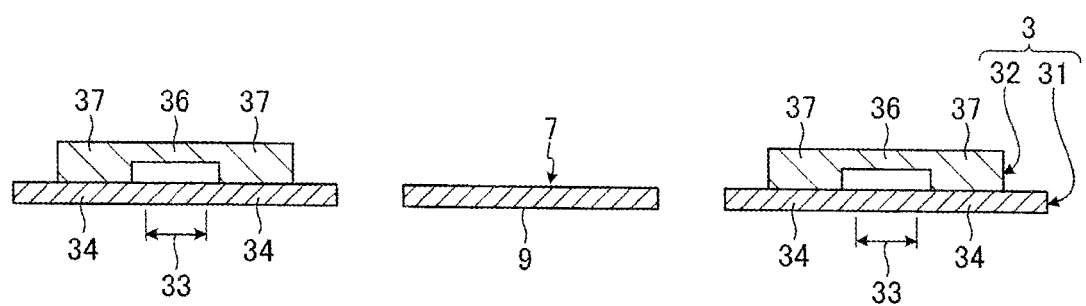
FIG. 8 is a sectional view taken along a line VIII-VIII in FIG. 7.
Figure 9:
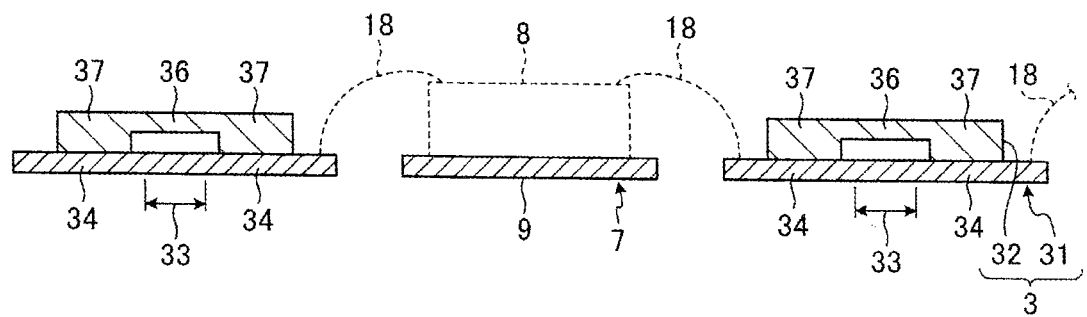
FIG. 9 is a sectional view illustrating a state in which a device chip is mounted in the frame illustrated in FIG. 8.
Figure 10:
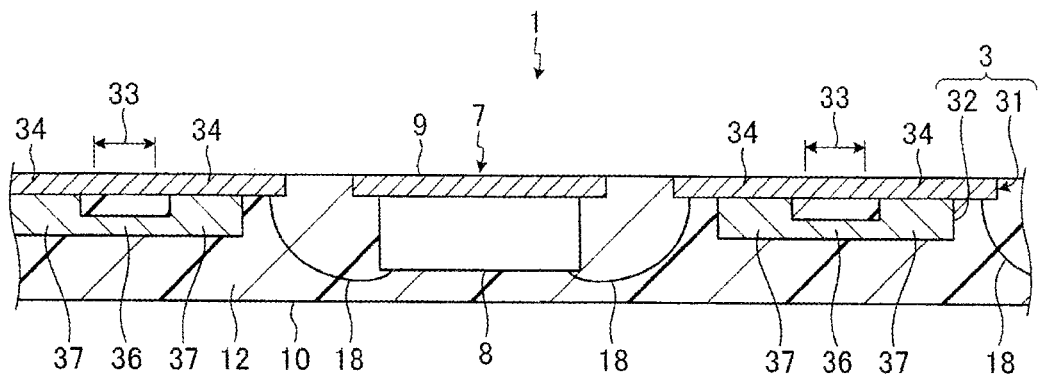
FIG. 10 is a sectional view illustrating a state in which the device chip illustrated in FIG. 9 is covered by a mold resin.

A package substrate, a package substrate processing method, and a packaged chip according to a first embodiment of the present invention will be described with reference to the drawings. FIG. 1 is a plan view schematically illustrating a package substrate according to the first embodiment. FIG. 2 is a side view of the package substrate illustrated in FIG. 1. FIG. 3 is a plan view of the undersurface side of the package substrate illustrated in FIG. 1. FIG. 4 is a perspective view schematically illustrating a packaged chip obtained by dividing the package substrate illustrated in FIG. 1. FIG. 5 is a plan view illustrating principal parts of a lead frame constituting a frame of the package substrate illustrated in FIG. 1. FIG. 6 is a plan view illustrating principal parts of a connection frame constituting the frame of the package substrate illustrated in FIG. 1. FIG. 7 is a plan view illustrating principal parts of the frame of the package substrate illustrated in FIG. 1. FIG. 8 is a sectional view taken along a line VIII-VIII in FIG. 7. FIG. 9 is a sectional view illustrating a state in which a device chip is mounted in the frame illustrated in FIG. 8. FIG. 10 is a sectional view illustrating a state in which the device chip illustrated in FIG. 9 is covered by a mold resin.

(Package Substrate)

A package substrate 1, which is illustrated in FIG. 1, FIG. 2, and FIG. 3, according to the first embodiment is subjected to cutting processing or the like and is thereby divided into individual packaged chips 2 one of which is illustrated in FIG. 4. The package substrate 1 is what is called a QFN package substrate in which device chips 8 mounted in a frame 3 made of a metal are covered by a mold resin 12.

As illustrated in FIG. 1, the package substrate 1 according to the first embodiment is formed in a flat-plate shape having a rectangular planar shape. The package substrate 1 includes the frame 3 in a rectangular flat-plate shape. The package substrate 1 includes, in the frame 3, device regions 4 and a peripheral surplus region 5 surrounding the device regions 4. The frame 3 is formed of a metal such as a metal including copper (that is, a copper alloy).

A plurality of planned dividing lines 6 intersecting each other are set in the device regions 4. Among the plurality of planned dividing lines 6 intersecting each other, some of them extend in a direction parallel with the longitudinal direction of the frame 3, and the other planned dividing lines 6 extend in a direction orthogonal to the longitudinal direction of the frame 3 and parallel with the width direction of the frame 3. The device chips 8 are arranged in supporting portions 7 demarcated by these plurality of planned dividing lines 6 intersecting each other. The planned dividing lines 6 are set to penetrate the frame 3. The supporting portions 7 include a part of the frame 3. The device chips 8 are arranged on an undersurface 10 (illustrated in FIG. 3 and the like) of the frame 3 which is opposite to a top surface 9 thereof. Incidentally, the top surface 9 of the frame 3 is also the top surface 9 of the package substrate 1 or the packaged chip 2. Each planned dividing line 6 is provided with electrodes 11 for connecting the packaged chips 2 to a wiring board or the like.

The electrodes 11 include a part of the frame 3. Each of the electrodes 11 in the first embodiment is positioned at the center in the width direction of the planned dividing line 6 and is formed linearly in a direction orthogonal to the planned dividing line 6. The electrodes 11 are connected to the device chip 8 by wires 18 illustrated in FIG. 9 and the like.

In the first embodiment, a plurality of device regions 4 (three device regions 4 in the first embodiment) are arranged at intervals in the longitudinal direction of the frame 3. The peripheral surplus region 5 is a region in which the device chips 8 are not arranged. The peripheral surplus region 5 is formed by the frame 3. The peripheral surplus region 5 surrounds the entire periphery of each device region 4 and connects the device regions 4 adjacent to each other.

In addition, as illustrated in FIG. 2 and FIG. 3, the package substrate 1 includes the mold resin 12 that seals (covers) each device region 4 on the undersurface 10 side. The mold resin 12 is formed of a thermoplastic resin. The mold resin 12 seals (covers) the device chips 8 and the wires 18 arranged on the undersurface 10 of the supporting portions 7 of the frame 3, and the planned dividing lines 6 are filled with the mold resin 12. On the undersurface 10 side of the frame 3, the mold resin 12 seals (covers) the whole of each device region 4. On the top surface 9 side of the frame 3, the mold resin 12 seals the insides of the planned dividing lines 6 in a state in which the supporting portions 7 having the device chips 8 arranged therein and the electrodes 11 are exposed.

The package substrate 1 is divided into individual packaged chips 2 as illustrated in FIG. 4 by severing the center in the width direction of each planned dividing line 6 in each device region 4. Thus, the package substrate 1 according to the first embodiment is a QFN package substrate in which the electrodes 11 formed of a metal are arranged in the planned dividing lines 6. However, without being limited to this, the package substrate 1 may be a chip scale packaging (CSP) substrate or the like. In addition, in the first embodiment, the packaged chip 2 divided from the package substrate 1 has a size of approximately 1 mm×1 mm as the lengths of respective sides and is thus a small chip having a small chip size.

In addition, in the first embodiment, as illustrated in FIG. 1, the package substrate 1 is provided with marks 13 for alignment at both end portions of the planned dividing line 6 on the top surface 9 of the frame 3, the marks 13 indicating cutting positions of the planned dividing lines 6 at a time of cutting processing. In the first embodiment, the marks 13 for alignment are arranged in positions at the center in the width direction of each planned dividing line 6 and at both end portions along the longitudinal direction of each planned dividing line 6.

In a packaged chip 2 manufactured by dividing the package substrate 1, the device chip 8 mounted on the supporting portion 7 of the metallic frame 3 is covered by the mold resin 12. As illustrated in FIG. 4, the packaged chip 2 includes the supporting portion 7 of the frame 3, the device chip 8 disposed on the undersurface 10 of the supporting portion 7, the electrodes 11, and the mold resin 12. The mold resin 12 seals the device chip 8 and the like in a state in which the top surface 9 of the supporting portion 7 and the electrodes 11 are exposed.

In addition, in the packaged chip 2 according to the first embodiment, the top surface 9 of the packaged chip 2, on which surface the supporting portion 7 is exposed, and a side surface 14 of the packaged chip 2 are connected to each other by a stepped portion 15 having a predetermined width and height. The stepped portion 15 is formed over the entire periphery of the top surface 9 so as to be connected to all of the side surfaces 14. The stepped portion 15 is provided on the top surface 9 side. The stepped portion 15 includes a flat second side surface 151 parallel with the side surfaces 14 and orthogonal to both the top surface 9 and the undersurface 10, a flat surface 152 continuous with the second side surface 151 and the side surfaces 14, and a connecting portion that connects the second side surface 151 and the flat surface 152 to each other. The flat surface 152 is formed to be flat along both the top surface 9 and the undersurface 10. The height of the stepped portion 15 is set in a design stage or the like in advance and is set at a predetermined depth smaller than the thickness of the electrodes 11.

In addition, the packaged chip 2 has a plating layer 16 (illustrated in FIG. 13) formed of a metal on the top surfaces of the electrodes 11. The plating layer 16 improves wettability of solder 22 (illustrated in FIG. 15) for fixing the packaged chip 2 to a wiring board 20 (illustrated in FIG. 15), with respect to the electrodes 11. The packaged chip 2 is mounted on the wiring board 20 with the electrodes 11 fixed to electrodes 21 of the wiring board 20 by the solder 22. Incidentally, the plating layer 16 is omitted in FIG. 4.

In addition, as illustrated in FIG. 2, the frame 3 of the package substrate 1 according to the first embodiment includes a lead frame 31 and a connection frame 32 superposed on the lead frame 31. The lead frame 31 and the connection frame 32 are formed of a metal such as a metal including copper (that is, a copper alloy) or the like, that is, the lead frame 31 and the connection frame 32 are metallic. Incidentally, same parts of the lead frame 31 and the connection frame 32 as in the frame 3 are identified by the same reference numerals, and description thereof will be omitted. The lead frame 31 is disposed on the top surface 9 side of the frame 3. The connection frame 32 is disposed on the undersurface 10 side of the frame 3.

As illustrated in FIG. 5, the lead frame 31 integrally includes a plurality of supporting portions 7, a plurality of first frame portions 33, a plurality of first electrode portions 34, and a surplus region constituent portion not illustrated, the surplus region constituent portion constituting the peripheral surplus region 5. The first frame portions 33 are formed in a lattice manner along the planned dividing lines 6 that demarcate the supporting portions 7 on which the device chips 8 are arranged. The first frame portions 33 are arranged on the periphery of each supporting portion 7. Incidentally, the first frame portions 33 are omitted in FIG. 1. The first frame portions 33 are formed linearly in parallel with the planned dividing lines 6. The first frame portions 33 are arranged at the centers in the width directions of the planned dividing lines 6. Incidentally, the first frame portions 33 are connected to the supporting portions 7 by connecting pieces 35. First frame portions 33 arranged in planned dividing lines 6 at outermost edges of each device region 4 among the plurality of planned dividing lines 6 are continuous with the surplus region constituent portion. The width of the first frame portions 33 is smaller than the width of the planned dividing lines 6.

The first electrode portions 34 extend linearly from the first frame portion 33 on both sides in the width direction of the first frame portion 33. The first electrode portions 34 are arranged within the planned dividing lines 6. Distal ends of the first electrode portions 34 are arranged at a distance from the supporting portions 7. The wires 18 are connected to the distal ends of the first electrode portions 34, and the first electrode portions 34 are thereby electrically connected to the device chips 8. The first electrode portions 34 constitute the above-described electrodes 11. In the first embodiment, the lead frame 31 is formed with the same thickness throughout the supporting portions 7, the first frame portions 33, and the first electrode portions 34.

As illustrated in FIG. 6, the connection frame 32 integrally includes a plurality of second frame portions 36, a plurality of second electrode portions 37, and a surplus region constituent portion not illustrated, the surplus region constituent portion constituting the peripheral surplus region 5. The second frame portions 36 are superposed on a side of the first frame portions 33 of the lead frame 31 on which side the device chips 8 are disposed, and the second frame portions 36 are formed in a lattice manner along the planned dividing lines 6. The second frame portions 36 are formed linearly in parallel with the planned dividing lines 6. The second frame portions 36 are arranged at the centers in the width directions of the planned dividing lines 6. Second frame portions 36 arranged in planned dividing lines 6 at outermost edges of each device region 4 among the plurality of planned dividing lines 6 are continuous with the surplus region constituent portion. The width of the second frame portions 36 is smaller than the width of the planned dividing lines 6.

The second electrode portions 37 extend linearly from the second frame portion 36 on both sides in the width direction of the second frame portion 36. The second electrode portions 37 are arranged within the planned dividing lines 6. Distal ends of the second electrode portions 37 are arranged at a distance from the supporting portions 7. The distal ends of the second electrode portions 37 are arranged closer to the second frame portions 36 than the distal ends of the first electrode portions 34. The second electrode portions 37 are superposed on a side of the first electrode portions 34 of the lead frame 31 on which side the device chips 8 are disposed. The second electrode portions 37 are thereby electrically connected to the first electrode portions 34.

Thus, as illustrated in FIG. 7 and FIG. 8, the frame 3 is formed by superposing, on each other, the first frame portions 33 of the lead frame 31 disposed on the top surface 9 side and the second frame portions 36 of the connection frame 32 disposed on the undersurface 10 side, and thus superposing the first electrode portions 34 and the second electrode portions 37 on each other. In addition, in the first embodiment, as illustrated in FIG. 8, the distal ends of the second electrode portions 37 are formed in a shape protruding to the first electrode portions 34 more than the second frame portions 36 and are connected to the first electrode portions 34 of the lead frame 31, the second frame portions 36 are superposed on the first frame portions 33 at an interval from the first frame portions 33, and proximal end portions of the second electrode portions 37 are superposed on the first electrode portions 34 at an interval from the first electrode portions 34.

In the package substrate 1 of the above-described configuration, after the lead frame 31 and the connection frame 32 of the frame 3 are superposed on each other, as illustrated in FIG. 9, a device chip 8 is disposed on the undersurface 10 of the supporting portion 7, and the first electrode portions 34 are connected to the device chip 8 by wires 18. After the device chip 8 is disposed on the supporting portion 7, as illustrated in FIG. 10, the package substrate 1 is manufactured by covering the device chip 8, the wires 18, the connection frame 32, and the like by the mold resin 12. Thus, the mold resin 12 covers the device chip 8 disposed to be electrically connected to the first electrode portions 34 of the lead frame 31 and the connection frame.

(Package Substrate Processing Method)

Figure 11:
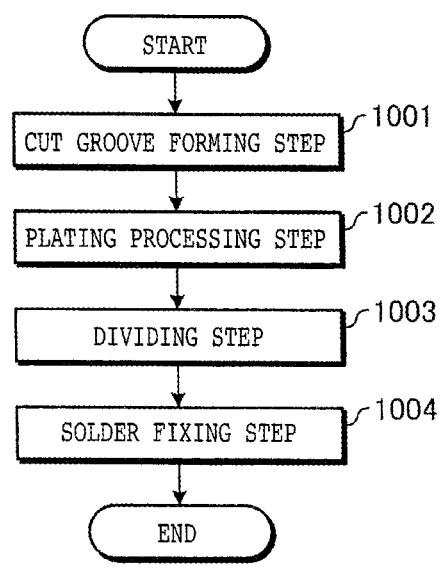
FIG. 11 is a flowchart illustrating a flow of a package substrate processing method according to the first embodiment.

FIG. 11 is a flowchart illustrating a flow of the package substrate processing method according to the first embodiment. The package substrate processing method is a method that divides the package substrate 1 into individual packaged chips 2 and fixes the packaged chip 2 to the wiring board 20. As illustrated in FIG. 11, the package substrate processing method includes a cut groove forming step 1001, a plating processing step 1002, a dividing step 1003, and a solder fixing step 1004.

(Cut Groove Forming Step)

Figure 12:
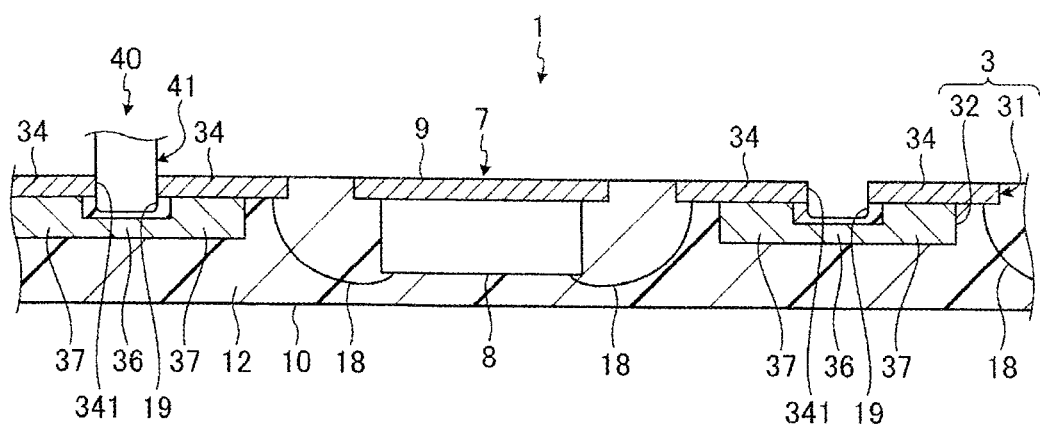
FIG. 12 is a sectional view schematically illustrating a cut groove forming step of the package substrate processing method illustrated in FIG. 11.

FIG. 12 is a sectional view schematically illustrating the cut groove forming step of the package substrate processing method illustrated in FIG. 11. The cut groove forming step 1001 is a step of making a first cutting blade 41 cut into a first frame portion 33 of the lead frame 31 along a planned dividing line 6 on the top surface 9 on which the lead frame 31 of the package substrate 1 is exposed, thereby forming a cut groove 19 having a depth not reaching the second frame portion 36 of the connection frame 32 covered by the mold resin 12, and exposing cut surfaces 341 of first electrode portions 34 that are severed when the first frame portion 33 is cut, to the inner surface of the cut groove 19.

In the cut groove forming step 1001, a cutting apparatus 40 holds under suction the undersurface 10 side of the package substrate 1, that is, the mold resin 12, on a holding surface of a chuck table not illustrated. In the cut groove forming step 1001, the cutting apparatus 40 images a mark 13 on the top surface 9 of the package substrate 1 held on the chuck table by an imaging unit, and carries out alignment that aligns the first cutting blade 41 and a planned dividing line 6 with each other.

In the cut groove forming step 1001, while moving the chuck table and the first cutting blade 41 relative to each other along the planned dividing line 6, the cutting apparatus 40 makes the cutting edge of the first cutting blade 41 cut into the first frame portion 33 located at the center in the width direction of the planned dividing line 6 to a depth not reaching the second frame portion 36 covered by the mold resin 12, as illustrated in FIG. 12. The cutting apparatus 40 thereby forms a cut groove 19 having the above-described depth in each planned dividing line 6 of the package substrate 1. Incidentally, the depth is shallower than a distance from the top surface 9 of the package substrate 1 to the second frame portion 36. In addition, the thickness of the cutting edge of the first cutting blade 41 is equal to or more than the width of the first frame portion 33.

In the cut groove forming step 1001, the cutting apparatus 40 cuts and removes the whole of the first frame portion 33 by making the first cutting blade 41 cut into the first frame portion 33, and exposes the cut surfaces 341 of the first electrode portions 34, which are severed by the first cutting blade 41, to the inner surface of the cut groove 19 by severing proximal end portions of the first electrode portions 34. In the cut groove forming step 1001, the cutting apparatus 40 forms the cut groove 19 in all of the planned dividing lines 6. Thus, in the cut groove forming step 1001, the cutting apparatus 40 severs the first frame portions 33 of the lead frame 31.

(Plating Processing Step)

Figure 13:
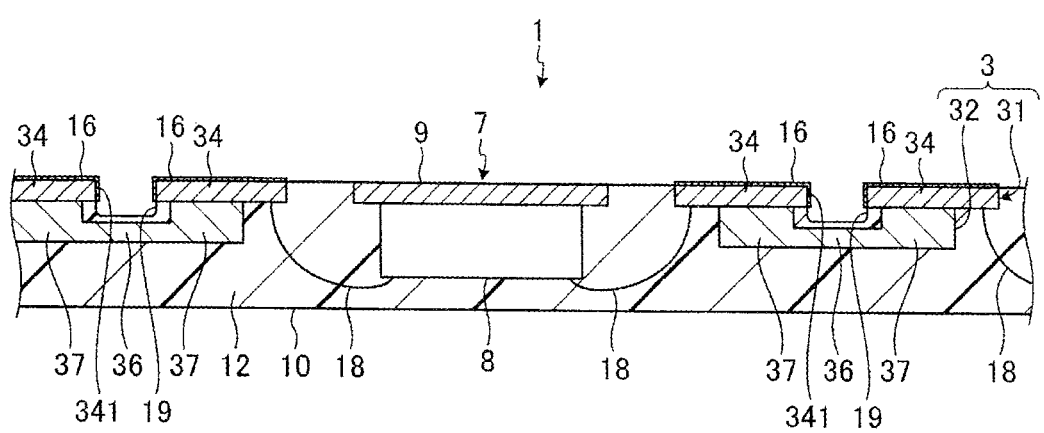
FIG. 13 is a sectional view schematically illustrating the package substrate that has undergone a plating processing step of the package substrate processing method illustrated in FIG. 11.

FIG. 13 is a sectional view schematically illustrating the package substrate 1 that has undergone the plating processing step of the package substrate processing method illustrated in FIG. 11. The plating processing step 1002 is a step of, after the cut groove forming step 1001 is performed, applying a voltage to the severed first electrode portions 34 via the connection frame 32, and thereby covering the exposed surfaces of the first electrode portions 34 with a plating layer 16 by electroplating.

In the plating processing step 1002, the first electrode portions 34 of the package substrate 1 that has undergone the cut groove forming step 1001 are immersed in an electrolytic solution. Herein, an unillustrated electrode in the electrolytic solution is used as an anode, and the first electrode portion 34 of the lead frame 31 is used as a cathode. While a substance (for example, tin) with which the first electrode portions 34 are desired to be plated is supplied to the electrolytic solution, a voltage is applied to the electrode and the connection frame 32 for a predetermined period of time. As illustrated in FIG. 13, in the plating processing step 1002, the exposed surfaces of the first electrode portions 34 are covered with the plating layer 16 by electroplating. Thus, in the package substrate processing method according to the first embodiment, the connection frame 32 forms an electrode when the cut surfaces 341 of the first electrode portions 34, which cut surfaces are formed by severing the first electrode portions 34 from the first frame portions 33, are subjected to electroplating processing.

(Dividing Step)

Figure 14:
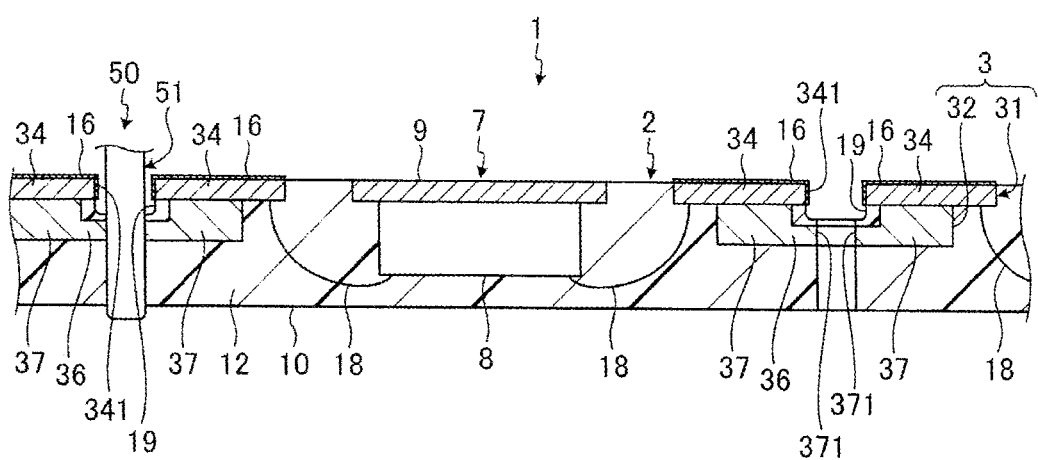
FIG. 14 is a sectional view schematically illustrating a dividing step of the package substrate processing method illustrated in FIG. 11.

FIG. 14 is a sectional view schematically illustrating the dividing step of the package substrate processing method illustrated in FIG. 11. The dividing step 1003 is a step of, after the plating processing step 1002 is performed, cutting the center in the width direction of the cut groove 19 by a second cutting blade 51 having a smaller cutting edge thickness than the first cutting blade 41, and thereby severing the connection frame 32 and the mold resin 12 and dividing the package substrate 1 into individual packaged chips 2.

In the dividing step 1003, a cutting apparatus 50 holds under suction the undersurface 10 side of the package substrate 1, that is, the mold resin 12, on a holding surface of a chuck table not illustrated. In the dividing step 1003, the cutting apparatus 50 images a mark 13 on the top surface 9 of the package substrate 1 held on the chuck table by an imaging unit, and carries out alignment that aligns the second cutting blade 51 and the cut groove 19 with each other.

In the dividing step 1003, while moving the chuck table and the second cutting blade 51 relative to each other along the cut groove 19, the cutting apparatus 50 makes the cutting edge of the second cutting blade 51 cut into the center in the width direction of the cut groove 19 until the cutting edge of the second cutting blade 51 reaches a clearance groove in the holding surface of the chuck table, as illustrated in FIG. 14. The cutting apparatus 50 thereby severs the center in the width direction of the cut groove 19 formed in each planned dividing line 6 of the package substrate 1. In addition, the thickness of the cutting edge of the second cutting blade 51 is smaller than the thickness of the cutting edge of the first cutting blade 41. Therefore, the second cutting blade 51 does not damage the plating layer 16 by coming into contact with the plating layer 16 covering the cut groove 19.

In the dividing step 1003, the cutting apparatus 50 severs the center in the width direction of the cut groove 19 formed in each planned dividing line 6 of the package substrate 1 by the second cutting blade 51, to thereby divide the package substrate 1 into individual packaged chips 2. Thus, the packaged chips 2 are divided from the package substrate 1 after the package substrate 1 has been subjected to the cut groove forming step 1001, the plating processing step 1002, and the dividing step 1003. Therefore, as illustrated in FIG. 4, the first electrode portions 34 of the lead frame 31 electrically connected to the device chip 8 are exposed on the top surface 9 and the second side surface 151 of the stepped portion 15 which side surface is continuous with the top surface 9, and cut surfaces 371 of the second electrode portions 37 of the connection frame 32 which electrode portions have end portions connected to the first electrode portions 34 are exposed on the side surfaces 14 continuous from the stepped portion 15 to the undersurface 10 of the packaged chip 2. Incidentally, while three first electrode portions 34 and three second electrode portions 37 are exposed on the second side surface 151 and the side surface 14, respectively, in FIG. 4, five first electrode portions 34 and five second electrode portions 37 are exposed on the second side surface 151 and the side surface 14, respectively, in the first embodiment.

In addition, in the packaged chip 2, as illustrated in FIG. 14, the first electrode portions 34 are covered by the plating layer 16, but the second electrode portions 37 of the connection frame 32 are not covered by the plating layer 16. Thus, in the individually divided packaged chip 2, the cut surfaces 341 of the first electrode portions 34 are covered by the plating layer 16 as in what is called the wettable flank. The packaged chip 2 configured as described above is obtained by covering, by the mold resin 12, the device chip 8 mounted on the supporting portion 7 of the lead frame 31 made of a metal.

(Solder Fixing Step)

Figure 15:
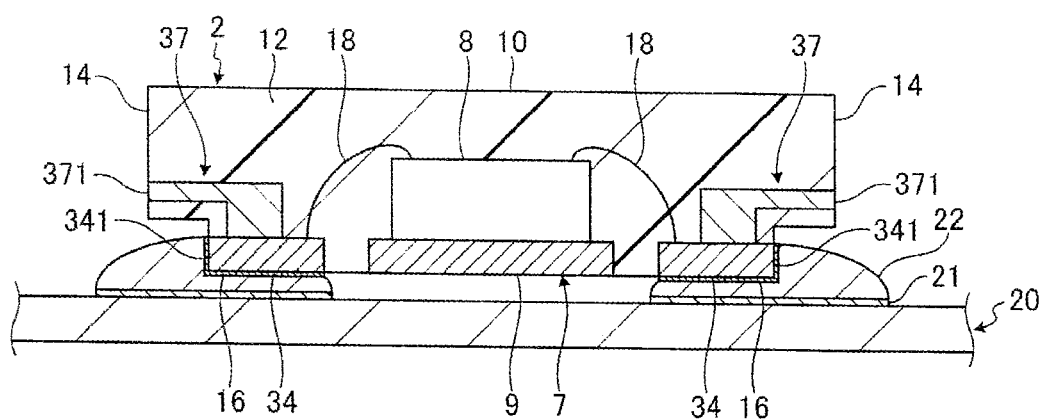
FIG. 15 is a sectional view schematically illustrating a solder fixing step of the package substrate processing method illustrated in FIG. 11.

FIG. 15 is a sectional view schematically illustrating the solder fixing step of the package substrate processing method illustrated in FIG. 11. The solder fixing step 1004 is a step of connecting the plated first electrode portions 34 of the packaged chip 2 and the electrodes 21 of the wiring board 20, which is a mounting destination, to each other by solder 22 with the top surface 9 of the packaged chip 2 disposed to face the wiring board 20.

As illustrated in FIG. 15, in the solder fixing step 1004, the top surface 9 of the packaged chip 2 is disposed above the wiring board 20, solder 22 is supplied between the plating layer 16 covering the first electrode portions 34 and the wiring board 20, and the first electrode portions 34 are thus fixed and connected to the electrodes 21 by the solder 22. Incidentally, in the packaged chip 2 fixed and connected to the wiring board 20 in the solder fixing step 1004, the cut surfaces 341 of the first electrode portions 34 severed in the cut groove forming step 1001 are covered by the plating layer 16 formed by plating processing, so that wettability of the solder 22 with respect to the first electrode portions 34 is ensured.

As described above, in the package substrate 1 according to the first embodiment, the frame 3 includes the lead frame 31 and the connection frame 32 that are superposed on each other, the second electrode portions 37 of the connection frame 32 are connected to the first electrode portions 34 of the lead frame 31, and the second frame portions 36 of the connection frame 32 are superposed on the first frame portions 33 of the lead frame 31 at an interval from the first frame portions 33. Therefore, in the package substrate 1, the plating layer 16 can be formed on the cut surfaces 341 of the first electrode portions 34 and the like by applying a voltage via the connection frame 32, even when the first frame portions 33 are severed.

Hence, in the package substrate 1, as in what is called the wettable flank, the cut surfaces 341 of the first electrode portions 34, that is, exposed surfaces of the electrodes 11, can be subjected to plating processing, and the connection frame 32 is provided such that the first electrode portions 34 can fully be cut (severed) instead of being half cut. It is thereby possible to sever the first electrode portions 34 while maintaining wettability of the side surfaces (cut surfaces) of the electrodes 11. As a result, the package substrate 1 produces an effect of being able to relax accuracy of cutting depth. In addition, because the plating layer 16 can be formed on the cut surfaces 341 of the first electrode portions 34 and the like even when the first electrode portions 34 are severed, the package substrate 1 produces effects of being able to suppress clogging of the first cutting blade 41 and being able to suppress the occurrence of a burr.

In addition, in the package substrate processing method according to the first embodiment, even when the first frame portions 33 of the package substrate 1 are severed in the cut groove forming step 1001, the plating layer 16 can be formed on the cut surfaces 341 of the first electrode portions 34 and the like by applying a voltage via the connection frame 32 in the plating processing step 1002. As a result, the package substrate processing method enables the first electrode portions 34 to be severed while maintaining wettability of the side surfaces (cut surfaces) of the electrodes 11, and therefore produces an effect of being able to relax accuracy of cutting depth. Further, because, in the package substrate processing method, the plating layer 16 can be formed on the cut surfaces 341 of the first electrode portions 34 and the like even when the first electrode portions 34 are severed, the package substrate processing method produces effects of being able to suppress clogging of the first cutting blade 41 and being able to suppress the occurrence of a burr.

In addition, in the packaged chip 2 according to the first embodiment, the first electrode portions 34 of the lead frame electrically connected to the device chip 8 are exposed on the second side surface 151 of the stepped portion 15, the cut surfaces 371 of the second electrode portions 37 of the connection frame 32 which second electrode portions have end portions connected to the first electrode portions 34 are exposed on the side surfaces 14, and the first electrode portions 34 are covered by the plating layer 16. Therefore, in the packaged chip 2, even when the first frame portions 33 of the package substrate 1 are severed, the plating layer 16 can be formed on the cut surfaces 341 of the first electrode portions 34 and the like by applying a voltage via the connection frame 32.

As a result, the packaged chip 2 produces an effect of being able to relax accuracy of cutting depth because the first electrode portions 34 can be severed while wettability of the first electrode portions 34 is maintained. In addition, because the plating layer 16 can be formed on the cut surfaces 341 of the first electrode portions 34 and the like even when the first electrode portions 34 are severed, the packaged chip 2 produces effects of being able to suppress clogging of the first cutting blade 41 and being able to suppress the occurrence of a burr.

It is to be noted that the present invention is not limited to the foregoing first embodiment. That is, the present invention can variously be modified and carried out without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method for processing a package substrate in which a device chip mounted in a frame is covered by a mold resin, the package substrate including
a metallic lead frame that includes first frame portions in a lattice shape along planned dividing lines demarcating a supporting portion on which the device chip is disposed and a plurality of first electrode portions extending from each of the first frame portions toward opposite sides,
a connection frame that includes second frame portions in a lattice shape along the planned dividing lines and a plurality of second electrode portions extending from each of the second frame portions toward opposite sides, the connection frame being superposed on a side of the lead frame on which the device chip is disposed, and
the mold resin that covers the connection frame and the device chip disposed to be electrically connected to the first electrode portions of the lead frame,
the method comprising:
a cut groove forming step of forming a cut groove having a depth not reaching the connection frame covered by the mold resin, by making a first cutting blade cut into one of the first frame portions of the lead frame along corresponding one of the planned dividing lines on a top surface on which the lead frame of the package substrate is exposed, and exposing, in the cut groove, cut surfaces of the first electrode portions that are severed when the first frame portion is cut;
a plating processing step of, after the cut groove forming step is performed, covering the exposed cut surfaces of the first electrode portions with a plating layer by electroplating by applying a voltage to the severed first electrode portions via the connection frame;
a dividing step of, after the plating processing step is performed, dividing the package substrate into individual packaged chips by cutting a center of the cut groove by a second cutting blade thinner than the first cutting blade to severe the connection frame and the mold resin; and
a solder fixing step of connecting the first electrode portions of one of the packaged chips that have undergone plating processing and electrodes of a wiring board as a mounting destination to one another by solder, with the top surface of the packaged chip disposed to face the wiring board.

* * * * *